United States Patent
Ozaki et al.

(10) Patent No.: US 6,872,476 B2
(45) Date of Patent: Mar. 29, 2005

(54) ORGANIC ELECTRO-LUMINESCENT DEVICE

(75) Inventors: Tadayoshi Ozaki, Minamiashigara (JP); Mieko Seki, Minamiashigara (JP); Hirohito Yoneyama, Minamiashigara (JP); Daisuke Okuda, Minamiashigara (JP); Hidekazu Hirose, Minamiashigara (JP); Takeshi Agata, Minamiashigara (JP); Toru Ishii, Minamiashigara (JP); Kiyokazu Mashimo, Minamiashigara (JP); Katsuhiro Sato, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 33 days.

(21) Appl. No.: 10/388,753

(22) Filed: Mar. 17, 2003

(65) Prior Publication Data

US 2004/0062948 A1 Apr. 1, 2004

(30) Foreign Application Priority Data

Sep. 20, 2002 (JP) .......................... 2002-275906

(51) Int. Cl.$^7$ ............................. H05B 33/12

(52) U.S. Cl. ................ 428/690; 428/423.1; 428/917; 313/504; 313/506

(58) Field of Search ................. 428/690, 917, 428/423.1; 313/504, 506

(56) References Cited

U.S. PATENT DOCUMENTS 6,582,876 B2 * 6/2003 Wolk et al. ................ 430/200

\* cited by examiner

*Primary Examiner*—Dawn Garrett
(74) *Attorney, Agent, or Firm*—Fildes & Outland, P.C.

(57) ABSTRACT

An organic electro-luminescent device comprising one or more organic compound layers sandwiched between a pair of electrodes, at least one of which electrodes is transparent or semi-transparent, wherein at least one of the one or more organic compound layers comprises at least one polyurethane compound having a repeating unit represented by the following general formula (I). At least one of A and B in general formula (I) represents a divalent group represented by one of the following general formulae (II) to (VI).

—(OCONH-A-NHCOO—B)$_n$—   General Formula (I)

General Formula (II)

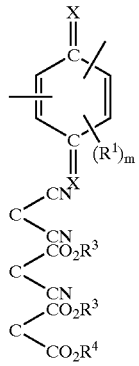

(II-1)

(II-2)

(II-3)

General Formula (III)

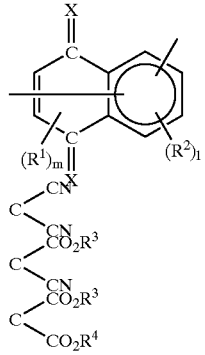

(III-1)

(III-2)

(III-2)

General Formula (IV)

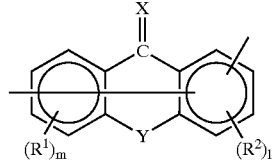

General Formula (V)

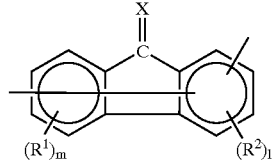

General Formula (VI)

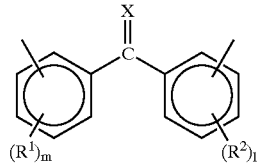

17 Claims, 1 Drawing Sheet

ORGANIC ELECTRO-LUMINESCENT DEVICE

BACKGROUND OF THE INVENTION

1. Field of the Invention

The present invention relates to an organic electro-luminescent device, which may hereinafter be referred to as an "organic EL device", and specifically to an organic EL device that can be easily manufactured by utilizing a specific polyurethane compound, and further, that have improved in brightness, stability and durability.

2. Description of the Related Art

EL devices, which are spontaneous-luminescent all solid state devices, can provide a high visibility and a high impact resistance and therefore are expected to find wide applications. The devices with inorganic fluorescent materials are currently dominant, however, they have problems such as a high manufacturing cost due to the requirement of an AC voltage of 200V or higher for driving, and insufficient brightness.

The study of the EL devices with organic compounds began by using single-crystal materials such as anthracene for thestarter, however, such single-crystal materials gave a thick film of about 1 mm and required a driving voltage of 100 V or higher. Thus, a vapor deposition technique has been tested to form a thin film (Thin Solid Films, Vol. 94, 171 (1982)). The film formed by this method, however, still requires a high driving voltage of 30 V. In addition, the film has a low density of the electron/hole carrier and provides a low probability of photon generation by carrier recombination, giving insufficient brightness.

In recent years, there has been reported an EL device, among EL devices of the function separation type in which a thin film of a hole transporting low-molecular weight organic compound and a thin film of a fluorescent low-molecular weight organic compound having the electron transporting function are laminated sequentially by vacuum vapor deposition method, which can provide high brightness of 1000 cd/m$^2$ at a low voltage of about 10 V (Appl. Phys. Lett., vol. 51, 913(1987)) and, ever since, active research and development has been conducted on layered EL devices.

Such type of EL device, however, can easily form a pinhole since a thin film of 0.1 μm or less is formed through plural vapor deposition steps, therefore, it is necessary to regulate the film thickness under the strictly controlled conditions in order to obtain sufficient performance. Therefore, the productivity is low and the enlargement of area is difficult. In addition, since such type of EL device is driven under a current density as high as several mA/cm$^2$, a great amount of Joule heat generated. In many cases, therefore, the pheromenon wherein the hole transporting low-molecular weight compound and the low-molecular weight fluorescent organic compound each formed into a film in an amorphous-glass state by vapor deposition gradually crystallize and eventually melt so that the brightness is reduced or breakdown occurs. As the result, the problem of life-shortening of the device also occurs. For example, in the case of the electron transporting material, it is proposed so far, as described in Japanese Patent Laid-Open No. 7-109454 (1995), to use oxadiazole derivatives including 2-(4-biphenylyl)-5-(4-tert-butylphenyl)-1,3,4-oxadiazole (PBO). The obtained film, however, can easily crystallize and be also insufficient in terms of charge transportation/injection property. Moreover, because of a poor variety of the electron transporting material other than the oxadiazole compounds, there has currently been a demand for developing a new material excellent in the charge transportation/injection property as well as in terms of low-voltage driving and high efficiency.

On the other hand, with the aim of solving the problems with the productivity and the large-area formation of the layered EL device, research and development has been carried out on EL devices of the monolayer structure. Proposed examples of such devices include a device with a conductive polymer such as poly(p-phenylenevinylene) (Nature, Vol. 357, 477 (1992) etc.) and a device with a mixture of an electron transporting material and a fluorescent pigment in a hole transporting polyvinylcarbazole (the Japan Society of Applied Physics 38th Meeting Proceedings 31p-G-12 (1991)), but they have not yet been comparable in such as brightness and luminous efficiency to the layered EL devices using the low-molecular weight organic compounds.

SUMMARY OF THE INVENTION

The present invention aims at the solution of the above conventional problems and the obtainment of the goal mentioned below. It is therefore an object of the invention to provide an organic electro-luminescent device that has sufficient brightness, are excellent in stability and durability, and can be formed in a large area and easily manufactured.

Active investigations on the electron transporting materials have been made in order to achieve the above object. As a result, it has been found that the compound having at least one specific structure selected from the structures represented by the general formula (I) below can provide a good charge (particularly electron) injection property, a good charge (particularly electron) mobility, and a good thin-film formability for the organic electro-luminescent device, and the invention has been completed.

According to a first aspect of the invention, there is provided an organic electro-luminescent device comprising one or more organic compound layers sandwiched between a pair of electrodes including an anode and a cathode, at least one of which is transparent or semi-transparent, wherein at least one of the one or more organic compound layers contains at least one of polyurethane compound having a repeating unit represented by the following general formula (I):

—(OCONH-A-NHCOO—B)$_n$—    General Formula (I)

in the general formula (I), A and B each independently represent a substituted or unsubstituted divalent aliphatic or aromatic hydrocarbon, at least one of A and B represents a divalent group represented by one of the following general formulae (II) to (VI), and n represents a number from 10 to 2000,

General Formula (II)

(II-1)

(II-2)

(II-3)

in general formula (II), $R^1$ represents an alkyl group, an aryl group, a halogen atom, a nitro group, an acyl group, or an amino group, X represents an oxygen atom or a group represented by the above formulae (II-1) to (II-3) in which $R^3$ and $R^4$ each independently represent an alkyl group or an aryl group, and m represents an integer from 0 to 2, General Formula (III)

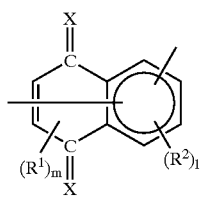

(III-1)

(III-2)

(III-2)

in general formula (III), $R^1$ and $R^2$ each independently represent an alkyl group, an aryl group, a halogen atom, a nitro group, an acyl group, or an amino group, X represents an oxygen atom or a group represented by the above formulae (III-1) to (III-3) in which $R^3$ and $R^4$ each independently represent an alkyl group or aryl group, and m and l each independently represent an integer from 0 to 2, General Formula (IV)

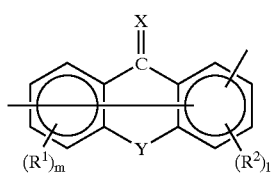

in general formula (IV), $R^1$, $R^2$, X, m, and l each independently have the same meaning as $R^1$, $R^2$, X, m, and l in the general formula (III), respectively, and Y represents C=X in which X has the same meaning as X in general formula (III), O, S, $SO_2$, or $NR^5$ in which $R^5$ represents a hydrogen atom, an alkyl group, an aryl group, or an acyl group, General Formula (V)

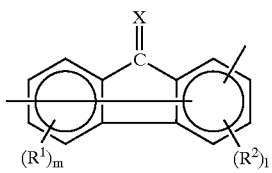

in general formula (V), $R^1$, $R^2$, X, m, and l each independently have the same meaning as $R^1$, $R^2$, X, m, and l in general formula (III), respectively, General Formula (VI)

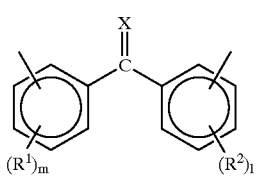

in general formula (VI), $R^1$, $R^2$, X, m, and l each independently have the same meaning as $R^1$, $R^2$, X, m, and l in general formula (III), respectively.

In the organic EL device of the invention, the polyurethane-containing organic compound layer preferably further comprises a low-molecular weight organic compound. The low-molecular weight organic compound is preferably an electron-accepting compound or an electron-donating compound.

Preferred examples of the electron-accepting compound include aromatic nitro compounds, cyclic carboxylic anhydrides, aromatic carboxylic imides, quinones, tetracyanoxydimethane derivatives, and fluorenone derivatives.

Preferred examples of the electron-donating compound include oxadiazoles, styryl system compounds, carbazole compounds, pyrazoline system compounds, triphenylamine system compounds, tetrathiafulvalene, and N,N,N',N'-tetraethylphenylenediamine.

In the organic EL device of the invention, the polyurethane compound(s) may be a copolymerized polyurethane compound(s) including another repeating unit.

According to a second aspect of the invention, there is provided an organic electro-luminescent device, wherein the one or more organic compound layers comprise a low-molecular weight organic compound.

According to a third aspect of the invention, there is provided an organic electro-luminescent device, wherein the low-molecular weight organic compound is an electron-accepting compound.

According to a fourth aspect of the invention, there is provided an organic electro-luminescent device, wherein the electron-accepting compound comprises at least one selected from the group consisting of aromatic nitro compounds, cyclic carboxylic anhydrides, aromatic carboxylic imides, quinones, tetracyanoxydimethane derivatives, and fluorenone derivatives.

According to a fifth aspect of the invention, there is provided an organic electro-luminescent device, wherein the low-molecular weight organic compound is an electron-donating compound.

According to another aspect of the invention, there is provided an organic electro-luminescent device, wherein the electron-donating compound comprises at least one selected from the group consisting of oxadiazoles, styryl system compounds, carbazole compounds, pyrazoline system compounds, triphenylamine sytem compounds, tetrathiafulvalene, and N,N,N',N'-tetraethylphenylenediamine.

According to another aspect of the invention, there is provided an organic electro-luminescent device, wherein the polyurethane compound is a copolymerized polyurethane compound comprising a repeating unit other than the repeating unit represented by general formula (I).

According to another aspect of the invention, there is provided an organic electro-luminescent device, wherein the one or more organic compound layers comprise at least a light emitting layer and an electron transporting layer, and the electron transporting layer includes the at least one polyurethane compound having the repeating unit represented by general formula (I).

According to another aspect of the invention, there is provided an organic electro-luminescent device, wherein the one or more organic compound layers comprise at least a hole transporting layer, a light emitting layer, and an electron transporting layer, and the electron transporting layer includes the at least one polyurethane compound having the repeating unit represented by general formula (I).

According to another aspect of the invention, there is provided an organic electro-luminescent device, wherein the one or more organic compound layers comprise at least a light emitting layer, and the light emitting layer includes the at least one polyurethane compound having the repeating unit represented by general formula (I).

According to another aspect of the invention, there is provided an organic electro-luminescent device, wherein the one or more organic compound layers comprise at least a hole transporting layer and a light emitting layer, and the light emitting layer includes the at least one polyurethane compound having the repeating unit represented by general formula (I).

According to another aspect of the invention, there is provided an organic electro-luminescent device, wherein the light emitting layer comprises a charge transporting material.

According to another aspect of the invention, there is provided an organic electro-luminescent device, wherein the light emitting layer comprises a charge transporting material.

According to another aspect of the invention, there is provided an organic electro-luminescent device, wherein the charge transporting material comprises a hole transporting polymer.

According to another aspect of the invention, there is provided an organic electro-luminescent device, wherein the charge transporting material comprises a hole transporting polymer.

According to another aspect of the invention, there is provided an organic electroluminescent device, wherein the hole transporting layer comprises a hole transporting polymer.

According to another aspect of the invention, there is provided an organic electro-luminescent device, wherein the hole transporting layer comprises a hole transporting polymer.

The organic compound layer constituting the organic EL device of the invention can be broadly classified into a monolayer structure consisting of a light emitting layer having a charge transporting function and a function separation type multilayer structure comprising plural layers different from each other in function, which include at least a light emitting layer or a light emitting layer having a charge transporting function. Examples of the function separation type multilayer structure include (1) a structure comprising a light emitting layer and an electron transporting layer, which may hereinafter be referred to as layered structure (1); (2) a structure comprising a hole transporting layer, a light emitting layer, and an electron transporting layer, which may hereinafter be referred to as layered structure (2); and (3) a structure comprising a hole transporting layer and a light emitting layer having a charge transporting function, which may hereinafter be referred to as layered structure (3). Concerning these structures, the hole transporting layer encompasses a hole injection layer, and the electron transporting layer encompasses an electron injection layer. It will be understood that the layered structure is not limited to these structures.

Where the organic compound layer consists of the light emitting layer having the charge transporting function, the light emitting layer contains the polyurethane compound(s).

Where the organic compound layer comprises the layers different in function, layered structure (1) contains the polyurethane compound(s) in at least one of the light emitting layer and the electron transporting layer; layered structure (2) contains the polyurethane compound(s) in the electron transporting layer; and layered structure (3) contains the polyurethane compound(s) in the light emitting layer having the charge transporting function.

The organic compound layer may further contain a charge transporting material (a hole transporting material or an electron transporting material) other than the polyurethane compound(s). The additional charge transporting material is preferably a hole transporting polymer. It is also preferred that the hole transporting layer contains the hole transporting polymer.

DESCRIPTION OF THE PREFERRED EMBODIMENTS

Figure 1:
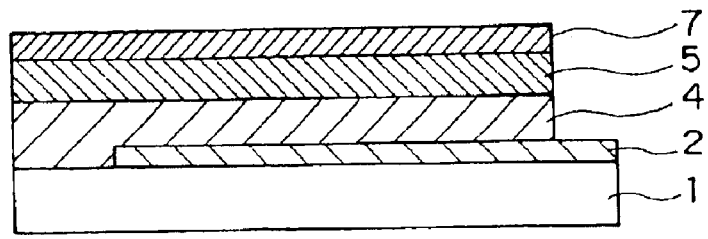
FIG. 1 is a schematic diagram showing an example of the layered structure in the organic EL device of the invention, in which reference numeral 1 represents a transparent insulator substrate, 2 a transparent electrode, 3 a hole transporting layer, 4 a light emitting layer, 5 an electron transporting layer, and 7 a back-side electrode, respectively.

The present invention is described in detail as follows.

The organic EL device of the invention comprises one or more organic compound layers sandwiched between a pair of electrodes comprised of an anode and a cathode at least one of which is transparent or semi-transparent, wherein at least one of the organic compound layers contains at least one of polyurethane compounds having the repeating unit represented by the following general formula (I):

The polyurethane compound(s) exhibit a high charge (particularly electron)-transporting performance and excellent heat stability at the time of light emission. Therefore, the organic EL device including the polyurethane compound(s) also has unconventionally sufficient brightness and is excellent in stability and durability. The polyurethane compound(s) have excellent solubility and compatibility in solvents or resins and therefore the organic EL device using the polyurethane compound(s) can be formed in a large area and easily manufactured.

  General Formula (I)

In general formula (I), A and B each independently represent a substituted or unsubstituted divalent aliphatic or aromatic hydrocarbon, at least one of A and B represents a divalent group represented by one of the general formulae (II) to (VI), and n represents a number from 10 to 2000.

In general formula (I), examples of the divalent aliphatic hydrocarbon represented by A or B include a divalent straight chain hydrocarbon group with 1 to 20 carbon atoms or a divalent branched chain hydrocarbon group with 2 to 20 carbon atoms. Of these groups, a divalent straight chain hydrocarbon group with 4 to 12 carbon atoms and a divalent branched chain hydrocarbon group with 3 to 7 carbon atoms are suitable. Examples of the substituent in the divalent aliphatic hydrocarbon include an alkoxyl group and a halogen atom. Examples of the divalent aromatic hydrocarbon include the groups represented by the general formulae (1) to (7) in the following:

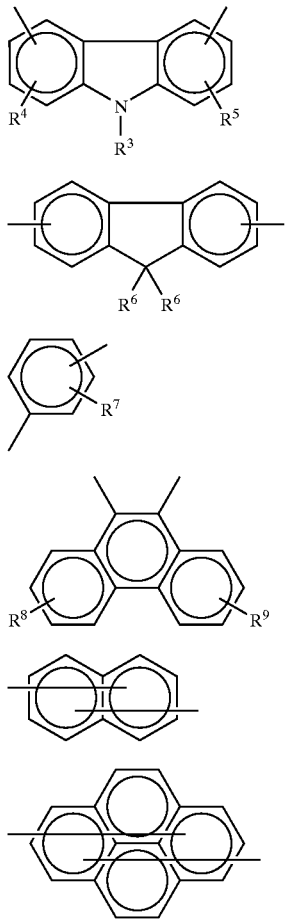

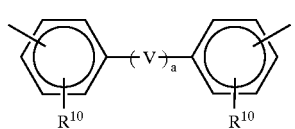

In general formulae (1) to (7), $R^3$ represents a hydrogen atom, an alkyl group with 1 to 4 carbon atoms, a substituted or unsubstituted phenyl group, or a substituted or unsubstituted aralkyl group, $R^4$ to $R^{10}$ each independently represent a hydrogen atom, an alkyl group with 1 to 4 carbon atoms, an alkoxyl group with 1 to 4 carbon atoms, a substituted or unsubstituted phenyl group, a substituted or unsubstituted aralkyl group, or a halogen atom, a represents 0 or 1, and V represents a group selected from the groups represented by formulae (8) to (17) in the following and preferably represents one of the groups represented by formulae (18) to (20) in the following, and in formulae (8) to (17), b is an integer of 1 to 10 and c is an integer of 1 to 3.

 (8)

 (9)

—O— (10)

—S— (11)

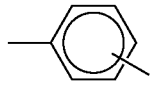 (12)

 (13)

—C(CF$_3$)$_2$— (14)

—Si(CH$_3$)$_2$— (15)

—CH═CH— (16)

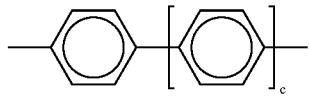 (17)

General formulae (II) to (VI) below represented by at least one of A and B in general formula (I) are described in the following.

General Formula (II)

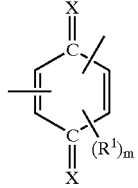

 (II-1)

 (II-2)

-continued

(II-3)

In general formula (II), $R^1$ represents an alkyl group, an aryl group, a halogen atom, a nitro group, an acyl group, or an amino group, X represents an oxygen atom or a group represented by one of above formulae (II-1) to (II-3) in which $R^3$ and $R^4$ each represent an alkyl group or an aryl group, and m represents an integer of 0 to 2. Preferably, $R^1$ represents an alkyl group, a halogen atom, a nitro group, or an amino group, X represents an oxygen atom or the group represented by above formula (II-1), and m represents an integer of 0 to 2.

General Formula (III)

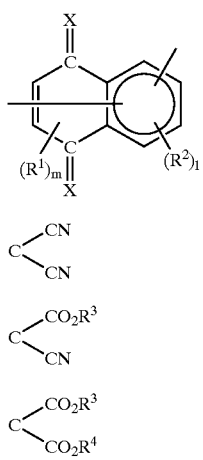

(III-1)

(III-2)

(III-2)

In general formula (III), $R^1$ and $R^2$ each independently represent an alkyl group, an aryl group, a halogen atom, a nitro group, an acyl group, or an amino group, X represents an oxygen atom or a group represented by one of above formulae (III-1) to (III-3), wherein $R^3$ and $R^4$ each represent an alkyl group or an aryl group, and m and l each independently represent an integer of 0 to 2. Preferably, $R^1$ and $R^2$ each independently represent an alkyl group, a halogen atom, a nitro group, or an amino group, X represents an oxygen atom or a group represented by above formula (III-1), and m and l each independently represent an integer of 0 to 2.

General Formula (IV)

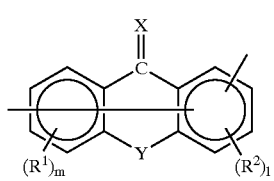

In general formula (IV), $R^1$, $R^2$, X, m, and l each independently have the same meaning as $R^1$, $R^2$, X, m, and l in above general formula (III), respectively, and Y represents C=X in which X has the same meaning as X in general formula (III), O, S, $SO_2$, or $NR^5$ in which $R^5$ represents a hydrogen atom, an alkyl group, an aryl group, or an acyl group. Preferably, $R^1$ and $R^2$ each independently represents an alkyl group, a halogen atom, a nitro group, or an amino group, X represents an oxygen atom or the group represented by above formula (III-1), Y represents C=O or C=C(CN)$_2$, and m and l each independently represents an integer of 0 to 2.

General Formula (V)

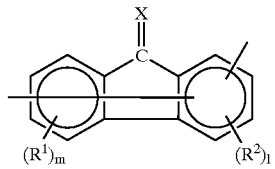

In general formula (V), $R^1$, $R^2$, X, m, and l each independently has the same meaning as $R^1$, $R^2$, X, m, and l in general formula (III), respectively. Preferably, $R^1$ and $R^2$ each independently represent an alkyl group, a halogen atom, a nitro group, or an amino group, X represents an oxygen atom or a group represented by above formula (III-1), and m and l each independently represent an integer of 0 to 2.

General Formula (VI)

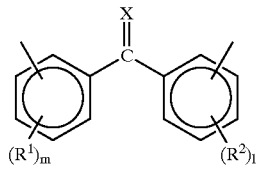

In general formula (VI), $R^1$, $R^2$, X, m, and l each independently have the same meaning as $R^1$, $R^2$, X, m, and l in general formula (III), respectively. Preferably, $R^1$ and $R^2$ each independently represent an alkyl group, a halogen atom, a nitro group, or an amino group, X represents an oxygen atom or a group represented by above formula (III-1), and m and l each independently represents an integer of 0 to 2.

The polyurethane compounds having the repeating unit represented by general formula (I) can be synthesized by any known polymerization method. For example, such a polymerization method is described in Jikken Kagaku Kouza (in Japanese) (Encyclopedia for Experimental Chemistry), Fourth Edition, Vol. 28, MARUZEN CO., LTD. (1992) and Shin Koubunshi Jikkengaku (in Japanese) (New Experimental Science of Polymers), Vol. 2, KYORITSU SHUPPAN CO., LTD. (1995).

Specifically, the diisocyanate represented by the general formula (VII) and the divalent alcohol represented by the general formula (VIII) are mixed in an equivalent amount and allowed to undergo polyaddition. Any catalyst that has been used in conventional polyaddition processes for polyurethane synthesis reaction can be used, including organometallic compounds such as dibutyltin(II) dilaurate, dibutyltin(II) diacetate, and lead naphthenate. In the polyurethane synthesis using an aromatic diisocyanate, a tertiary amine such as triethylenediamine can be used as the catalyst. The organometallic compound and the tertiary amine may be mixed for use as the catalyst.

In the reaction, based on 1 part by weight of the reactant, the catalyst is used in an amount ranging from 1/10,000 to 1/10 parts by weight, preferably from 1/1,000 to 1/50 parts by weight. Any solvent can be used, as far as the diisocyanate and the divalent alcohol can be dissolved in it. Preferably, the solvent for use has low polarity in terms of reactivity and forms no hydrogen bond with the alcohol. Effective examples of the solvent include toluene, chlorobenzene, dichlorobenzene, 1-chloronaphthalene.

Based on 1 part by weight of the reactant, the solvent is used in an amount ranging from 1 to 100 parts by weight, preferably from 2 to 50 parts by weight. The reaction temperature can freely be set as needed.

After the reaction is completed, the reaction solution as such is added dropwise to a poor solvent such as acetone and an alcohol such as methanol and ethanol, in which the polymer is hardly dissolved. The polyurethane is precipitated and separated, and then sufficiently washed with water or an organic solvent and dried. If necessary, a re-precipitation process may be repeated in which the polyurethane is dissolved in an appropriate organic solvent and then added dropwise to the poor solvent for allowing the polyurethane to precipitate. Preferably, the re-precipitation process is carried out with efficient stirring by means of a mechanical stirrer or the like. In the re-precipitation process, the solvent is used in an amount ranging from 1 to 100 parts by weight, preferably from 2 to 50 parts by weight to based on 1 part by weight of the polyurethane. Further, the poor solvent is used in an amount ranging from 1 to 1,000 parts by weight, preferably 10 to 500 parts by weight based on 1 part by weight of the polyurethane.

The desired polyurethane compound can be prepared by another process in which the diamines represented by the general formula (IX) and the bischloroformates represented by the general formula (X) are mixed in an equivalent amount and allowed to undergo polycondensation. Effective examples of the solvent include methylene chloride, dichloroethane, trichloroethane, tetrahydrofuran (THF), toluene, chlorobenzene, and 1-chloronaphthalene. Based on 1 part by weight of the reactant, the solvent is used in an amount ranging from 1 to 100 parts by weight, preferably 2 to 50 parts by weight. The reaction temperature can freely be set as needed. After the polymerization, the re-precipitation process is carried out for purification as described above.

If the diamine represented by the formula $NH_2$-A-$NH_2$ have a high basicity, the interfacial polymerization process can be used. In the process, the diamine is added to water, and an equivalent amount of an acid is added and dissolved, and then the solution containing the compound represented by above the general formula (X) in an equivalent amount to the diamine is added while vigorously stirring so that the polymerization can proceed. In this process, based on 1 part by weight of the diamine, the water is used in an amount ranging from 1 to 1,000 parts by weight, preferably 10 to 500 parts by weight. Examples of the effective solvent for dissolution include methylene chloride, dichloroethane, trichloroethane, toluene, chlorobenzene, and 1-chloronaphthalene. The reaction temperature can freely be set as needed. A phase-transfer catalyst such as an ammonium salt and a sulfonium salt is effectively used to promote the reaction. Based on 1 part by weight of the reactant, the phase-transfer catalyst is used in an amount ranging from 0.1 to 10 parts by weight, preferably 0.2 to 5 parts by weight.

| | |
|---|---|
| OCN-A-NCO | General formula (VII) |
| HO—B—OH | General formula (VIII) |
| $H_2$N-A-$NH_2$ | General formula (IX) |
| ClOCO—B—OCOCl | General formula (X) |

In the general formulae (VII) to (X), A and B each independently represents a substituted or unsubstituted divalent aliphatic or aromatic hydrocarbon, at least one of A and B represents the divalent group represented by one of above the general formulae (II) to (IV), and $R^6$ represents an alkyl group or a phenyl group. The meaning of A and B is the same as those in the above the general formula (I).

The polyurethane compounds having the repeating unit represented by the general formula (I) may be copolymerized polyurethane compounds including another repeating unit. Another repeating unit can be contained to the degree that performance of the polyurethane compound having the repeating unit represented by the general formula (I) can be maintained.

Examples of the repeating unit in the general formula (I) include but are not limited to those shown below. Hereinafter the polyurethane compound having the repeating unit corresponding to each "Compound No." row of the tables is indicated by illustrative compound No. For example, illustrative compound (12) is the polyurethane compound having the repeating unit corresponding to the Compound No. 12 row.

TABLE 1

| Compound No. | A | B |
|---|---|---|
| 1 | (benzophenone-4,4'-diyl) | —$(CH_2)_{10}$— |
| 2 | (benzophenone-4,4'-diyl) | —$CH_2$—C($CH_3$)($CH_3$)—$CH_2$— |
| 3 | (benzophenone-4,4'-diyl) | (4,4'-isopropylidenediphenylene) |

TABLE 1-continued

| Compound No. | A | B |
|---|---|---|
| 4 | 4,4'-dimethylbenzophenone | 4,4'-dimethylbenzophenone |
| 5 | bis(4-methylphenyl)dicyanoethylene | —(CH$_2$)$_{12}$— |
| 6 | bis(4-methylphenyl)dicyanoethylene | 2,2-bis(4-methylphenyl)propane |
| 7 | —(CH$_2$)$_6$— | 2,5-dimethyl-1,4-benzoquinone |
| 8 | 2,2-bis(4-methylphenyl)hexafluoropropane | 2,5-dimethyl-1,4-benzoquinone |
| 9 | 1,4-phenylene | 2,5-dimethyl-1,4-benzoquinone |
| 10 | —(CH$_2$)$_{12}$— | 2,5-dimethyl-7,7,8,8-tetracyanoquinodimethane |

TABLE 2
| Compound No. | A | B |
|---|---|---|
| 11 | —(CH$_2$)$_8$— | 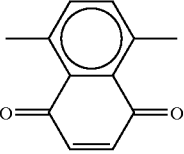 |
| 12 |  | 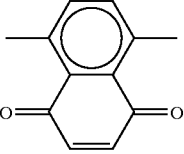 |
| 13 | 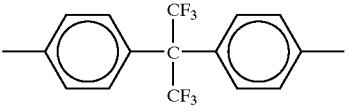 | 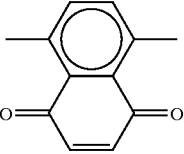 |
| 14 | —(CH$_2$)$_6$— | 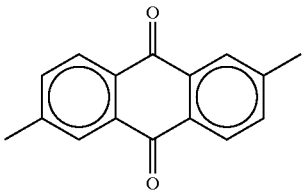 |
| 15 | —(CH$_2$)$_{10}$— | 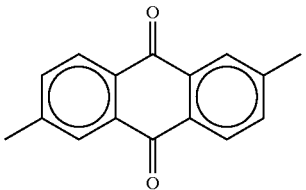 |
| 16 | 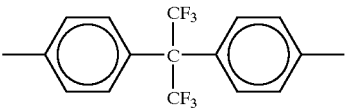 | 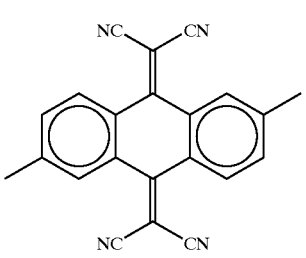 |
| 17 | —(CH$_2$)$_7$— | 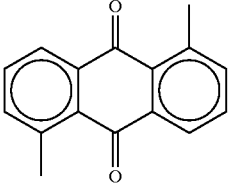 |
| 18 | —(CH$_2$)$_{10}$— | 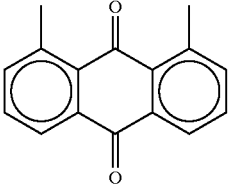 |

TABLE 2-continued
| Compound No. | A | B |
| --- | --- | --- |
| 19 | —(CH$_2$)$_6$— | 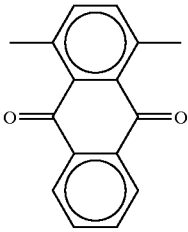 |
TABLE 3
| Compound No | A | B |
| --- | --- | --- |
| 20 | —(CH$_2$)$_8$— | 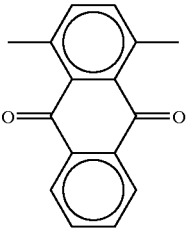 |
| 21 |  | 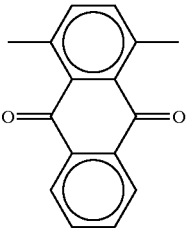 |
| 22 | 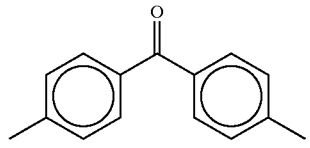 | 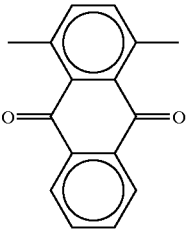 |
| 23 | 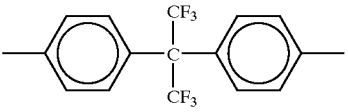 | 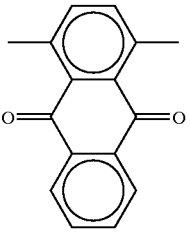 |
| 24 | —(CH$_2$)$_6$— | 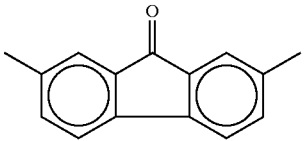 |

TABLE 3-continued

| Compound No | A | B |
|---|---|---|
| 25 | —(CH$_2$)$_7$— | 2,7-dimethylfluoren-9-one |
| 26 | 4,4'-dimethylbenzophenone | 2,7-dimethylfluoren-9-one |
| 27 | 2,2-bis(4-methylphenyl)hexafluoropropane | 2,7-dimethylfluoren-9-one |
| 28 | —(CH$_2$)$_8$— | 2,7-dichloro-3,6-dimethylfluoren-9-one |
| 29 | —(CH$_2$)$_7$— | 2,7-dinitro-3,6-dimethylfluoren-9-one |

TABLE 4

| Compound No. | A | B |
|---|---|---|
| 30 | 2,2-bis(4-methylphenyl)hexafluoropropane | 9-dicyanomethylene-2,7-dimethylfluorene |
| 31 | —(CH$_2$)$_6$— | 4,4'-dimethylbenzophenone |
| 32 | —(CH$_2$)$_8$— | 4,4'-dimethylbenzophenone |
| 33 | 2,2-bis(4-methylphenyl)hexafluoropropane | 3,6-dimethylfluoren-9-one |

TABLE 4-continued

| Compound No. | A | B |
|---|---|---|
| 34 | —(CH$_2$)$_7$— | [structure: dicyanomethylene fluorene with two methyl groups] |
| 35 | [structure: bis(phenyl) with C(CF$_3$)$_2$ bridge] | [structure: dicyanomethylene fluorene with two methyl groups] |
| 36 | —(CH$_2$)$_7$— | [structure: dimethylbenzophenone] |

The layered structure of the organic EL device of the invention is described in detail in the following.

The organic EL device of the invention comprises: a pair of electrodes, at least one of which is transparent or semi-transparent; and one or more organic compound layers sandwiched between the electrodes, which include a light emitting layer, wherein at least one of the organic compound layers contains the polyurethane compound(s).

Where the organic compound layer is a monolayer in the organic EL device of the invention, it corresponds to a light emitting layer having a charge transporting function, which contains the polyurethane compound(s).

Where the organic compound layer comprises different layers (i.e. in the case of the function separation type with layers different from each other in function), at least one of the layers is a light emitting layer or a light emitting layer having the charge transporting function. In this case, examples of the layered structure comprising the light emitting layer or the light emitting layer having the charge transporting function and another layer include layered structure (1) comprising a light emitting layer and an electron transporting layer, layered structure (2) comprising a hole transporting layer, a light emitting layer, and an electron transporting layer, and layered structure (3) comprising a hole transporting layer and a light emitting layer having a charge transporting function. In layered structures (1) to (3), the layer or layers other than the light emitting layer with or without the charge transporting function have a charge transporting function. In these structures, a hole injection layer belongs to the hole transporting layer, and an electron injection layer belongs to the electron transporting layer.

Layered structure (1) contains the polyurethane compound(s) in the electron transporting layer; layered structure (2) contains the polyurethane compound(s) in the electron transporting layer; and layered structure (3) contains the polyurethane compound(s) in the light emitting layer having the charge transporting function. However, the polyurethane compound-containing layer is not limited to these layers and can be selected from any other organic compound layer.

The light emitting layer having the charge transporting function, the hole transporting layer, or the electron transporting layer may contain an additional charge transporting material (a hole transporting material or an electron transporting material) other than the polyurethane compound(s). Such a material is described in detail below.

In order to further improve the electrical characteristics, a low-molecular weight organic compound for modulating the electron mobility may also be contained in the organic compound layer with the polyurethane compound(s) (the electron transporting material). The load of the specific low-molecular weight organic compound may be 1% to 30% by weight. Examples of the specific low-molecular weight organic compound include a low-molecular weight electron-accepting compound, a low-molecular weight electron-donating compound, and a low-molecular weight metal complex salt. Of these materials, preferred are the electron-accepting compound and the electron-donating compound. In particular, a preferred compound has the function of enhancing or controlling the electron conductivity by the action independent of the polyurethane compound(s) or the interaction such as the formation of a charge transfer complex with the polyurethane compound(s). One low-molecular weight organic compound may be used alone, or two or more low-molecular weight organic compounds may be used in combination.

Examples of the electron-accepting compound include aromatic nitro compounds such as 4-nitrobenzaldehyde; cyclic carboxylic anhydrides such as maleic anhydride; aromatic carboxylic imides such as N-(n-butyl)-1,8-naphthalimide; quinones such as p-chloranil and 2,3-dichloroanthraquinone; tetracyanoxy dimethane derivatives such as tetracyano-anthraquinone-dimethane; and fluorenone derivatives such as 9-dicyanomethylenefluorene-4-carboxylate.

Examples of the electron-donating compound include oxadiazoles such as 2,5-bis(4-dimethylaminophenyl)-1,3,4-oxadiazole; styryl system compounds such as 9-(4-diethylaminostyryl)anthracene; carbazole compounds such as N-methyl-N-phenylhydrazone-3-methylidene-9-ethylcarbazole; pyrazoline system compounds such as 1-phenyl-3-(p-dimethylaminostyryl)-5-(p-dimethylaminophenyl)-pyrazoline; triphenylamine system compounds such as N,N'-diphenyl-N,N'-bis(3-methylphenyl)benzidine, tri(4-methylphenyl)amine, and N,N-bis(3,4-dimethylphenyl)biphenyl-4-amine; tetrathiafulvalene; and N,N,N',N'-tetraethylphenylenediamine.

Examples of the organometallic complex salt include various chelate complexes such as acetylacetone complexes, acetoacetate complexes, oxyquinoline complexes of the transition metal, group III metal, or group VI metal, and phenanthroline complexes, and cyclopentadienyl complexes such as ferrocene.

Referring to the drawings, the invention is more specifically described in the following, but such description is not intended to limit the scope of the invention.

Figure 2:
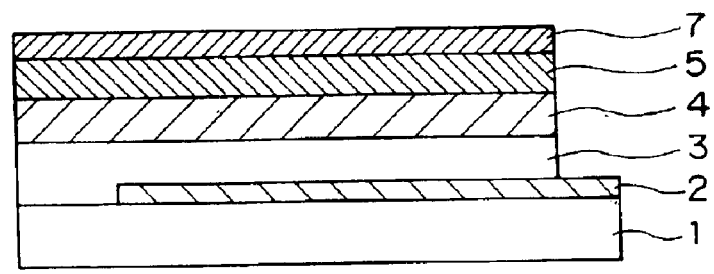
FIG. 2 is a schematic diagram showing another example of the layered structure in the organic EL device of the invention, in which reference numeral 3 represents a hole transporting layer, and the other reference numerals represent the same as those in FIG. 1.
Figure 3:
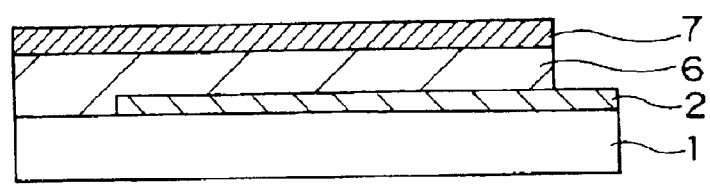
FIG. 3 is a schematic diagram showing yet another example of the layered structure in the organic EL device of the invention, in which reference numeral 6 represents a light emitting layer having a carrier transporting function, and the other reference numerals represent the same as those in FIG. 1.
Figure 4:
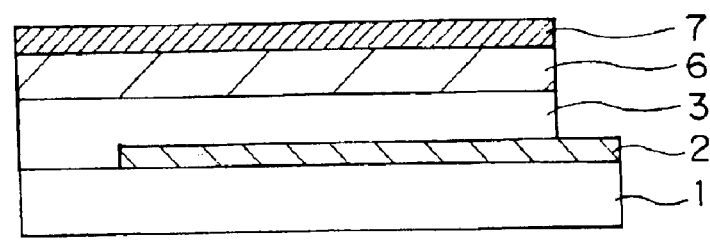
FIG. 4 is a schematic diagram showing a still further example of the layered structure in the organic EL device of the invention, in which the reference numerals represent the same as those in FIGS. 1 to 3.

FIGS. 1 to 4 are schematic cross-sectional views each showing the layered structure of the organic EL device according to the invention. FIGS. 1, 2, and 4 each show an example of the multilayer structure of the organic compound layer, and FIG. 3 shows an example of the monolayer structure of the organic compound layer. In FIGS. 1 to 4, the elements having the same function are indicated by the same reference numeral.

Referring to FIG. 1, the organic EL device includes a transparent insulator substrate 1, and a transparent electrode 2, a light emitting layer 4, an electron transporting layer 5, and a back-side electrode 7, which are sequentially stacked on the substrate 1. Referring to FIG. 2, the organic EL device includes a transparent insulator substrate 1, and a transparent electrode 2, a hole transporting layer 3, a light emitting layer 4, an electron transporting layer 5, and a back-side electrode 7, which are sequentially stacked on the substrate 1. Referring to FIG. 3, the organic EL device includes a transparent insulator substrate 1, and a transparent electrode 2, a light emitting layer 6 having a charge transporting function, and a back-side electrode 7, which are sequentially stacked on the substrate 1. Referring to FIG. 4, the organic EL device includes a transparent insulator substrate 1, and a transparent electrode 2, a hole transporting layer 3, a light emitting layer 6 having a charge transporting function, and a back-side electrode 7, which are sequentially stacked on the substrate 1.

The organic EL device as shown in each of FIGS. 1 and 2 can be provided with the luminescent material (the light emitting layer) by vacuum deposition or by applying and drying a solution or a dispersion. In the layered structure of such an organic EL device, the electron transporting layer is provided between the light emitting layer 4 and the back-side electrode 7 to improve the heat endurance, the carrier valance, or the luminous efficiency of the device in case that the thin film used is not excellent in quality or not clear in electron transportation.

The organic compound layer containing the polyurethane compound(s) can vary in function depending on the structure, and can serve as the electron transporting layer 5 in the layered structure of the organic EL device as shown in each of FIGS. 1 and 2, or can serve as the light emitting layer 6 having the charge transporting function in the layered structure of the organic EL device as shown in each of FIGS. 3 and 4.

In the organic EL device as shown in each of FIGS. 1 to 4, the transparent insulator substrate 1 is preferably made of a material transparent to the emitted light for output, such as glass and a plastic film. The material of the transparent electrode 2 preferably has an increased work function for the hole injection as well as transparency to the emitted light for output as that of the substrate has. Examples of such a material include an oxide film such as indium tin oxide (ITO), tin oxide (NESA), indium oxide, and zinc oxide; and vapor-deposited or sputtered gold, platinum and palladium.

In the layered structure of the organic EL device as shown in each of FIGS. 1 and 2, the electron transporting layer 5 may be formed of the polyurethane compound(s) alone or may contain, together with the polyurethane compound(s) (the electron transporting material), a low-molecular weight organic compound for modulating the electron mobility to have further improved electrical characteristics as described above. In addition, another general resin may be mixed to improve the film formability. Examples of such a resin include polycarbonate resins, polyester resins, methacrylic resins, acrylic resins, polyvinyl chloride resins, cellulose resins, urethane resins, epoxy resins, polystyrene resins, polyvinyl acetate resins, styrene-butadiene copolymers, vinylidene chloride-acrylonitrile copolymers, vinyl chloride-vinyl acetate-maleic anhydride copolymers, silicone resins, poly-N-vinylcarbazole resins, polysilane resins, and conductive resins such as polythiophene and polypyrrole. Preferably, such a resin is used in combination in such an amount that the content of the polyurethane compound(s) in the mixture material forming the electron transporting layer 5 is 60% by weight or more. An additive such as an antioxidant, an ultraviolet absorbing agent, and a plasticizer may also be used.

In the layered structure of the organic EL device as shown in each of FIGS. 1 and 2, the light emitting layer 4 uses a compound showing a high fluorescence quantum yield in solid state as the luminescent material. A low-molecular weight organic compound can be used as the luminescent material provided that a good thin film can be formed by vacuum deposition of it or by applying and drying a solution or dispersion containing it and a binder resin. A polymer can also be used as the luminescent material provided that a good thin film can be formed by applying and drying a solution or dispersion containing it. Preferred examples of the low-molecular weight organic compound include chelate type organometallic complexes, polynuclear or condensed aromatic ring compounds, perylene derivatives, coumarin derivatives, styrylarylene derivatives, silole derivatives, oxazole derivatives, oxathiazole derivatives, and oxadiazole derivatives. Preferred examples of the polymer include poly(para-phenylene) derivatives, poly(para-phenylenevinylene) derivatives, polythiophene derivatives, and polyacetylene derivatives. Preferred examples include but are not limited to illustrative compounds (XI-1) to (XI-15) as shown below. In illustrative compounds (XI-13) to (XI-15), n and x each independently represents an integer of 1 or more.

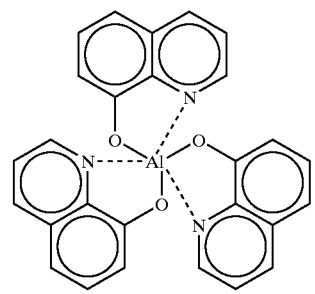

(XI-1)

-continued

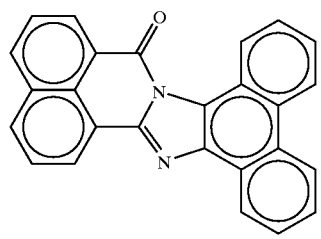 (XI-2)

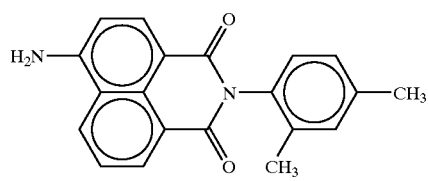 (XI-3)

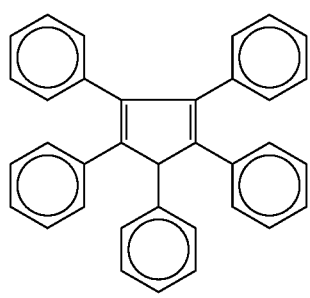 (XI-4)

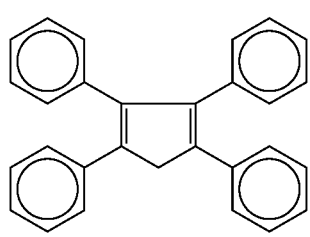 (XI-5)

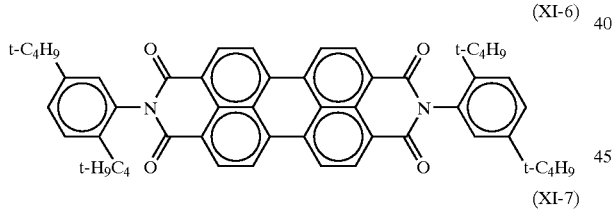 (XI-6)

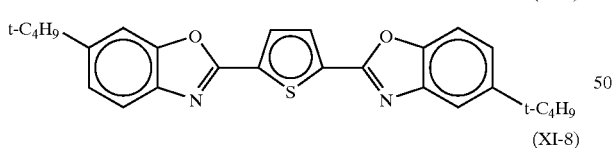 (XI-7)

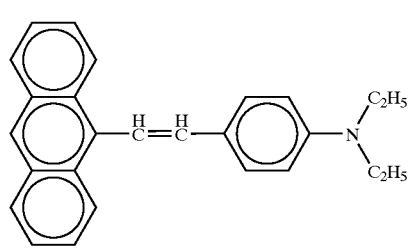 (XI-8)

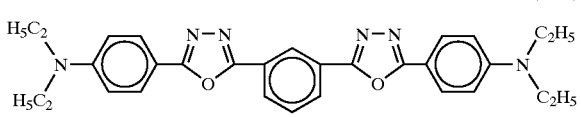 (XI-9)

-continued

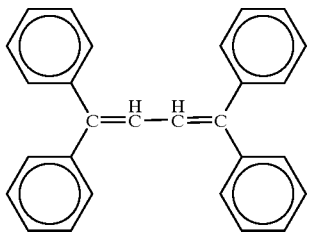 (XI-10)

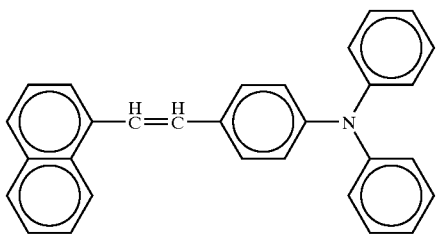 (XI-11)

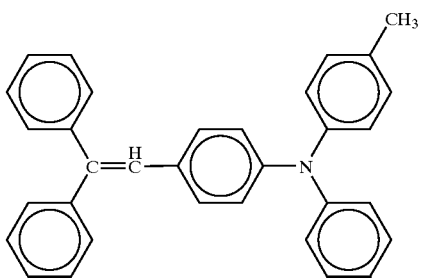 (XI-12)

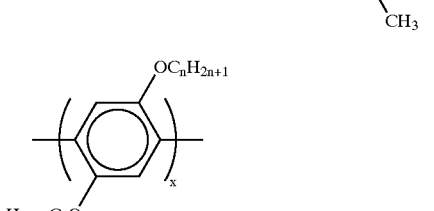 (XI-13)

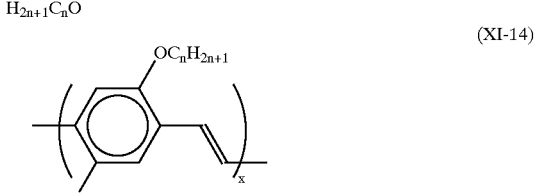 (XI-14)

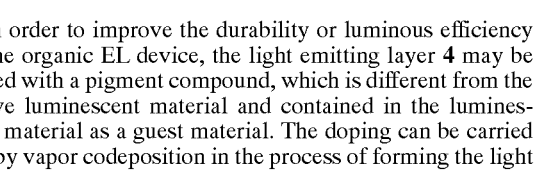 (XI-15)

In order to improve the durability or luminous efficiency of the organic EL device, the light emitting layer 4 may be doped with a pigment compound, which is different from the above luminescent material and contained in the luminescent material as a guest material. The doping can be carried out by vapor codeposition in the process of forming the light emitting layer by vacuum deposition. The doping can also be carried out by adding the material to the solution or dispersion, which is applied and dried to form the light emitting layer. The content of the pigment compound in the light emitting layer 4 doped is about 0.001% by weight to about 40% by weight, preferably 0.01% by weight to about 10% by weight. The pigment used for such doping should be an organic compound that has a good compatibility with the luminescent material and does not interfere with the proper thin-film formation of the light emitting layer. Preferred examples of such a pigment include DCM derivatives, quinacridone derivatives, rubrene derivatives, and porphyrin compounds. Preferred examples include but are not limited to illustrative compounds (XII-1) to (XII-4).

(XII-1)
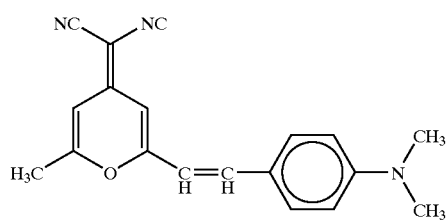

(XII-2)
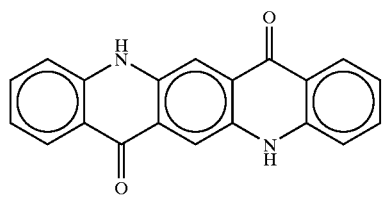

(XII-3)
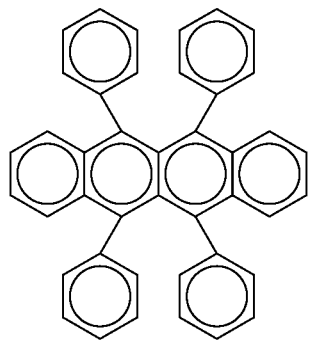

(XII-4)
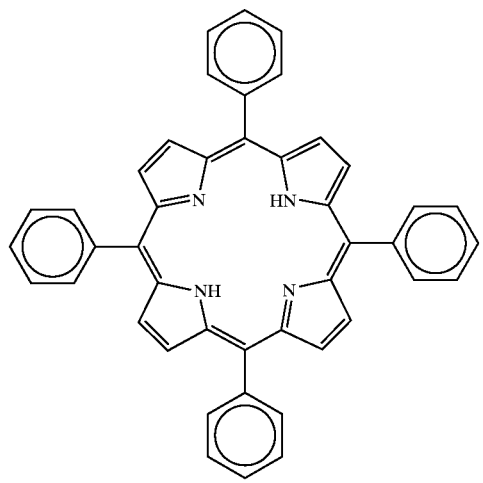

In the layered structure of the organic EL device as shown in each of FIGS. 2 and 4, the hole transporting layer 3 uses an electron-donating compound as the hole transporting material. A low-molecular weight organic compound can be used as the hole transporting material provided that a good thin film can be formed by vacuum deposition of it or by applying and drying a solution or dispersion containing it and a binder resin. A polymer can also be used as the hole transporting material provided that a good thin film can be formed by applying and drying a solution or dispersion containing it. Preferred examples of such a compound include tetraphenylenediamine derivatives, triphenylamine derivatives, carbazole derivatives, stilbene derivatives, arylhydrazone derivatives, and porphyrin compounds. Preferred examples include but are not limited to compounds (XIII-1) to (XIII-7).

(XIII-1)
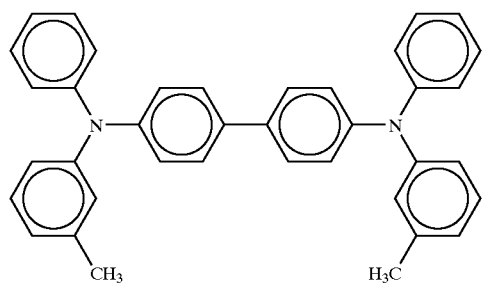

(XIII-2)
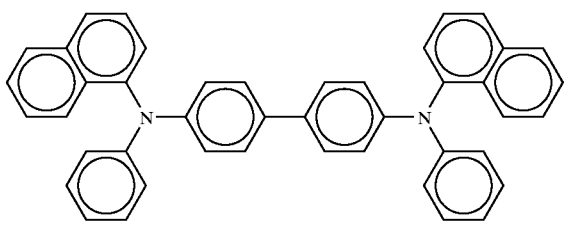

-continued

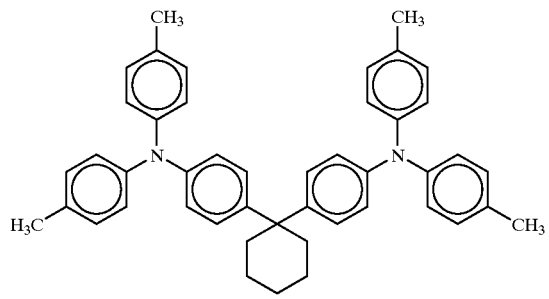
(XIII-3)

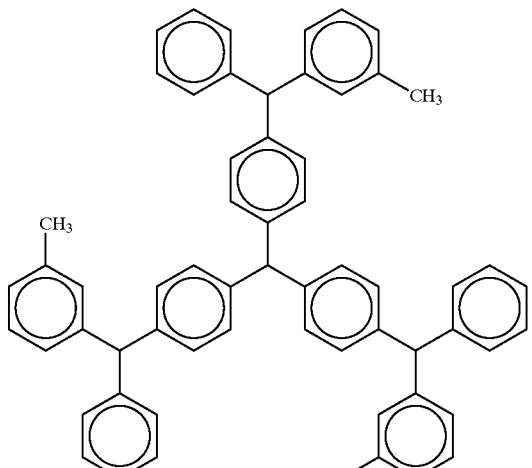
(XIII-4)

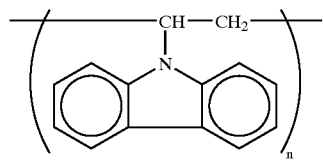
(XII-5)

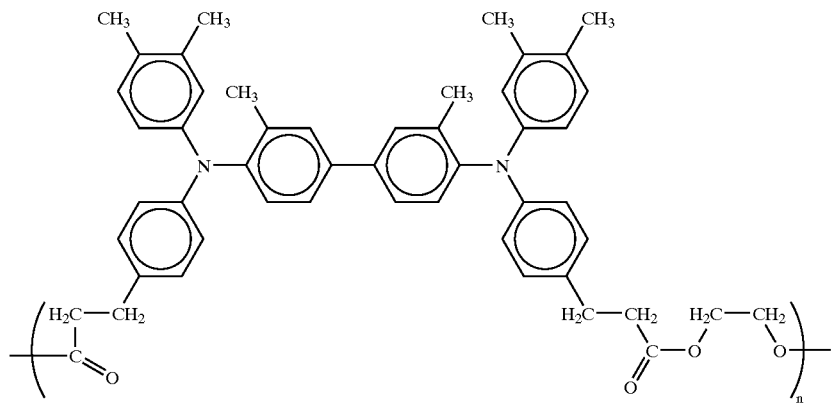
(XII-6)

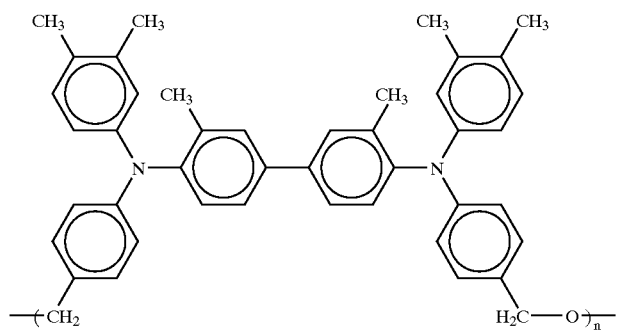
(XII-7)

In the layered structure of the organic EL device as shown in each of FIGS. 3 and 4, the light emitting layer 6 having the carrier transporting function is typically an organic compound layer that contains 50% by weight or less of the luminescent material dispersed in at least the polyurethane compound(s) (the electron transporting material). Each of above illustrative compounds (XI-1) to (XI-12) is preferably used as the luminescent material. An additional specific charge-transporting material (such as the above hole transporting polymer) other than the polyurethane compound(s) may be used in combination to adjust the balance between the hole and the electron injected into the organic EL device. The layer 6 may also be doped with a pigment compound other than the luminescent material. As in the FIG. 1 layered structure of the organic EL device, any other general resin may be mixed to improve the film formability.

The back-side electrode 7 uses a metal that can be vacuum-deposited and is low in work function for electron injection. Particularly preferred examples of such a metal include magnesium, aluminum, silver, indium, and alloys thereof. A cap layer may also be provided on the back-side electrode to prevent the device from deteriorating due to moisture or oxygen. Examples of the material for the cap layer include metals such as In, Sn, Pb, Au, Cu, Ag, and Al; metal oxides such as MgO, $SiO_2$, and $TiO_2$; and resins such as polyethylene resins, polyurea resins, and polyimide resins. The cap layer can be formed by vacuum deposition, sputtering, plasma polymerization, CVD, or coating.

In the process of the organic EL device as shown in each of FIGS. 1 to 4, the hole transporting layer 3 or the light emitting layer 4 is first formed on the transparent electrode 2 depending on the layered structure. The hole transporting layer 3 and the light emitting layer 4 are each formed by vacuum deposition of the hole-transporting or luminescent material or by dissolving or dispersing the material into an organic solvent and applying the resulting liquid on the transparent electrode 2 by spincoating, dipping, or the like.

The electron transporting layer 5 and the light emitting layer 6 having the carrier transporting function are then formed by dissolving or dispersing the polyurethane compound(s) alone or this or these electron transporting materials and the luminescent material, and optionally any other electron transporting material and/or any hole transporting material into an organic solvent and applying the resulting liquid on the transparent electrode by spincoating, dipping, or the like for film formation. The organic EL device can easily be manufactured by the above process.

The hole transporting layer 3, the light emitting layer 4 and the electron transporting layer 5 are each formed with a thickness of 0.1 µm or less, more preferably a thickness ranging from 0.03 to 0.08 µm. The light emitting layer 6 having the carrier transporting layer preferably has a thickness of 0.03 to 0.2 µm. In the dispersion, the hole transporting material, the luminescent material, the electron transporting material, or the polyurethane compound(s) may be dispersed in the form of molecule or fine particle. In the film process using the coating liquid, the solvent in which the material is to be dispersed in the form of molecule should be common to the hole transporting material, the luminescent material, the electron transporting material, and the polyurethane compound(s), and the solvent in which the material is to be dispersed in the form of fine particle should be selected depending on the solubility and the dispersibility of the hole transporting material, the luminescent material, and the electron transporting material, and the solubility of the polyurethane compound(s). The material(s) can be dispersed in the form of fine particle by using a ball mill, a sand mill, a paint shaker, an attriter, a ball mill, a homogenizer, a supersonic technique, or the like.

The back-side electrode 7 is finally formed on the electron transporting layer 5 or the light emitting layer 6 having the carrier transporting function by vacuum deposition, so that the device is completed.

The organic EL device of the invention is allowed to emit light by the application of a DC voltage of 4 to 20 V in a current density of 1 to 200 $mA/cm^2$.

EXAMPLES

The present invention is more specifically described by showing the examples in the following, but such examples are not intended to limit the scope of the invention. The electron transporting compounds for use in the examples were prepared as follows.

Synthesis Example 1 (Synthesis of Illustrative Compound (1))

To a 50 ml flask were added 1.74 g (10 mmol) of 1,10-decanediol and 30 ml of chlorobenzene, stirred, and dissolved. The solution of 2.64 g (10 mmol) of benzophenone-4,4'-diisocyanate dissolved in 10 ml of chlorobenzene was added dropwise to the flask over a period of 30 minutes and then heated and stirred at 150° C. for 2 hours under a stream of nitrogen. After the reaction was completed, the reaction solution was cooled to room temperature and added dropwise to 300 ml of methanol with stirring so that a polymer was allowed to precipitate. The resulting polymer was separated by filtration, thoroughly washed with methanol, and dried and then dissolved in 30 ml of tetrahydrofuran (THF). The solution was subjected to the re-precipitation step of adding dropwise to 300 ml of methanol three times, giving 3.8 g of an electron transporting polyurethane.

Synthesis Example 2 (Synthesis of Illustrative Compound (7))

To a 50 ml flask were added 1.40 g (10 mmol) of 2,5-dihydroxy-1,4-benzoquinone and 30 ml of chlorobenzene, stirred, and dissolved. The solution of 1.62 ml (10 mmol) of hexamethylenediisocyanate dissolved in 10 ml of chlorobenzene was added dropwise to the flask over a period of 30 minutes and then heated and stirred at 150° C. for 2 hours under a stream of nitrogen. After the reaction was completed, the reaction solution was cooled to room temperature and added dropwise to 300 ml of methanol with stirring so that a polymer was allowed to precipitate. The resulting polymer was separated by filtration, thoroughly washed with methanol, and dried and then dissolved in 30 ml of tetrahydrofuran (THF). The solution was subjected to the re-precipitation step of adding dropwise to 300 ml of methanol three times, giving 2.4 g of an electron transporting polyurethane.

Synthesis Example 3 (Synthesis of Illustrative Compound (24))

To a 50 ml flask were added 2.12 g (10 mmol) of 2,7-dihydroxy-9-fluorenone and 30 ml of chlorobenzene, stirred, and dissolved. The solution of 1.62 ml (10 mmol) of hexamethylenediisocyanate dissolved in 10 ml of chlorobenzene was added dropwise to the flask over a period of 30 minutes and then heated and stirred at 150° C. for 2 hours under a stream of nitrogen. After the reaction was completed, the reaction solution was cooled to room temperature and added dropwise to 300 ml of methanol with stirring so that a polymer was allowed to precipitate. The resulting polymer was separated by filtration, thoroughly washed with methanol, and dried and then dissolved in 30 ml of tetrahydrofuran (THF). The solution was subjected to the re-precipitation step of adding dropwise to 300 ml of methanol three times, giving 3.1 g of an electron transporting polyurethane.

Synthesis Example 4 (Synthesis of Illustrative Compound (31))

To a 50 ml flask were added 2.14 g (10 mmol) of 4,4'-dihydroxybenzophenone and 30 ml of chlorobenzene, stirred, and dissolved. The solution of 1.62 ml (10 mmol) of hexamethylenediisocyanate dissolved in 10 ml of chlorobenzene was added dropwise to the flask over a period of 30 minutes and then heated and stirred at 150° C. for 2 hours under a stream of nitrogen. After the reaction was completed, the reaction solution was cooled to room temperature and added dropwise to 300 ml of methanol with stirring so that a polymer was allowed to precipitate. The resulting polymer was separated by filtration, thoroughly washed with methanol, and dried and then dissolved in 30 ml of tetrahydrofuran (THF). The solution was subjected to the re-precipitation step of adding dropwise to 300 ml of methanol three times, giving 3.2 g of an electron transporting polyurethane.

Example 1

A glass substrate with an ITO electrode etched into the shape of a strip 2 mm in width was washed with 2-propanol (electronics industry grade, manufactured by Kanto Kagaku) by ultrasonic cleaning and then dried. On the substrate, a hole transporting layer of the hole transporting material corresponding to illustrative compound (XIII-2) was formed with a thickness of 0.050 µm and sequentially a light emitting layer of the luminescent material corresponding to illustrative compound (XI-1) was formed with a thickness of 0.065 µm each by vacuum deposition. Thereafter, illustrative compound (1) prepared according to Synthesis Example 1 was dissolved in a content of 5% by weight in m-cresol. The resulting solution was filtered with a 0.1 µm polytetrafluoroethylene (PTFE) filter. The filtered solution was applied by spincoating so that an electron transporting layer was formed with a thickness of 0.050 µm through the spincoating. A Mg—Ag alloy was finally deposited by vapor codeposition to form a back-side electrode 2 mm in width and 0.15 µm in thickness intersecting with the ITO electrode. The resulting organic EL device had an effective area of 0.04 cm$^2$.

Example 2

A mixture of 1 part by weight of illustrative compound (1) prepared according to Synthesis Example 1, 1 part by weight of the luminescent material corresponding to illustrative compound (XI-1), and 2 parts by weight of a hole transporting material of poly(N-vinylcarbazole) was prepared and then dispersed into m-cresol for 2 hours with a sand mill using 1 mmφ glass beads to form a 10% by weight dispersion. The dispersion was filtered with a 0.1 µm PTFE filter. The resulting solution was applied on a glass substrate with an ITO electrode etched into the shape of a strip 2 mm in width by spincoating so that a light emitting layer having a carrier transporting function was formed with a thickness of 0.15 µm. After a thorough drying step, a Mg—Ag alloy was deposited by vapor codeposition to form a back-side electrode 2 mm in width and 0.15 µm in thickness intersecting with the ITO electrode. The resulting organic EL device had an effective area of 0.04 cm$^2$.

Example 3

An organic EL device was prepared using the process of Example 1, except that illustrative compound (7) prepared according to Synthesis Example 2 was used in place of illustrative compound (1).

Example 4

An organic EL device was prepared using the process of Example 2, except that illustrative compound (7) prepared according to Synthesis Example 2 was used in place of illustrative compound (1).

Example 5

An organic EL device was prepared using the process of Example 1, except that illustrative compound (24) prepared according to Synthesis Example 3 was used in place of illustrative compound (1), and 1,1,2,2-tetrachloroethane was used as the solvent for applying the electron transporting layer.

Example 6

An organic EL device was prepared using the process of Example 2, except that illustrative compound (24) prepared according to Synthesis Example 3 was used in place of illustrative compound (1), and 1,1,2,2-tetrachloroethane was used.

Example 7

An organic EL device was prepared using the process of Example 1, except that illustrative compound (31) prepared according to Synthesis Example 4 was used in place of illustrative compound (1), and 1,1,2,2-tetrachloroethane was used.

Example 8

An organic EL device was prepared using the process of Example 2, except that illustrative compound (31) prepared according to Synthesis Example 4 was used in place of illustrative compound (1), and 1,1,2,2-tetrachloroethane was used.

Example 9

An organic EL device was prepared using the process of Example 1, except that a hole transporting layer 0.05 µm in thickness was formed by the steps of dissolving 5% by weight of the hole transporting polymer corresponding to illustrative compound (XIII-6) in dichloromethane, filtering the solution with a 0.1 µm polytetrafluoroethylene (PTFE) filter, and applying the filtered solution by spincoating.

Comparative Example 1

A glass substrate with an ITO electrode etched into the shape of a strip 2 mm in width was washed with 2-propanol (electronics industry grade, manufactured by Kanto Kagaku) by ultrasonic cleaning and then dried. On the substrate, a hole transporting layer of the hole transporting material corresponding to illustrative compound (XIII-2) was formed with a thickness of 0.050 µm and sequentially a light emitting layer of the luminescent material corresponding to illustrative compound (XI-1) was formed with a thickness of 0.065 µm each by vacuum deposition. Thereafter, an electron transporting layer of illustrative compound (XIV) represented by the structural formula below was formed with a thickness of 0.050 µm by vacuum deposition. A Mg—Ag alloy was finally deposited by vapor codeposition to form a back-side electrode 2 mm in width and 0.15 µm in thickness intersecting with the ITO electrode. The resulting organic EL device had an effective area of 0.04 cm$^2$.

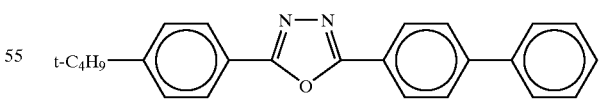

(XIV)

Comparative Example 2

A mixture of 2 parts by weight of a hole transporting material of poly(vinylcarbazole) (PVK), 0.1 parts by weight of the luminescent material corresponding to illustrative compound (XI-1), and 1 part by weight of the electron transporting material corresponding to illustrative compound (XIV) was prepared and then dissolved in dichloroethane to form a 10% by weight solution. The solution was filtered with a 0.1 μm PTFE filter. The filtered solution was applied on a glass substrate with an ITO electrode etched into the shape of a strip 2 mm in width by spincoating so that a hole transporting layer was formed with a thickness of 0.15 μm. After a thorough drying step, a Mg—Ag alloy was deposited by vapor codeposition to form a back-side electrode 2 mm in width and 0.15 μm in thickness intersecting with the ITO electrode. The resulting organic EL device had an effective area of 0.04 cm².

Comparative Example 3

An organic EL device was prepared using the process of Comparative Example 1, except that the formation of the electron transporting layer was omitted.

Comparative Example 4

An organic EL device was prepared using the process of Comparative Example 2, except that the formation of the electron transporting layer was omitted.

Evaluation

The organic EL devices as prepared above were subjected to the light emission measurement in which a DC voltage was applied between the ITO electrode (plus) and the Mg—Ag back-side electrode (minus) in vacuum ($133.3 \times 10^{-3}$ Pa ($10^{-3}$ Torr)) in order to evaluate the maximum brightness and the emitted light color. The results are shown in Table 5. The organic EL devices were also measured for the light emission life in dry nitrogen. In the evaluation of the light emission life, the current value was set so as to provide an initial brightness of 50 cd/m², and the time period after which the brightness was reduced to half of the initial value under the constant current drive was determined as the life (hours) of device. Each life of device and driving current density measured at that time is also shown in Table 5.

TABLE 5

|  | Maximum Brightness (cm/m²) | Color of Emitted Light | Driving Current Density (mA/cm²) | Life of Device (hours) |
| --- | --- | --- | --- | --- |
| Example 1 | 1580 | Green | 7.1 | 32 |
| Example 2 | 1100 | Green | 8.4 | 31 |
| Example 3 | 1610 | Green | 7.4 | 30 |
| Example 4 | 1135 | Green | 9.0 | 29 |
| Example 5 | 1600 | Green | 7.5 | 30 |
| Example 6 | 1490 | Green | 8.7 | 28 |
| Example 7 | 1588 | Green | 7.6 | 36 |
| Example 8 | 1057 | Green | 8.9 | 31 |
| Example 9 | 1450 | Green | 7.6 | 33 |
| Comparative Example 1 | 1380 | Green | 8.5 | 13 |
| Comparative Example 2 | 950 | Green | 9.8 | 10 |
| Comparative Example 3 | 1180 | Green | 8.5 | 19 |
| Comparative Example 4 | 850 | Green | 9.8 | 15 |

The results in Table 5 show that the organic EL device with at least one urethane compound selected from the structures represented by above the general formula (1) can have a high brightness and a high efficiency. It is also understood that a good thin film with fewer defects such as a pinhole can be formed by the use of spincoating, dipping, or the like, and such a film can easily be formed in a large area by the use of spincoating, dipping, or the like. It is also understood that the organic EL device of the invention formed through such a process can be advantageous in the cost of manufacturing. As described above, according to the invention, the organic EL device can be provided with sufficient brightness and excellent stability and durability and be formed in a large area and easily be manufactured.

What is claimed is:

1. An organic electro-luminescent device comprising one or more organic compound layers sandwiched between a pair of electrodes including an anode and a cathode, at least one of which is transparent or semi-transparent, wherein at least one of the one or more organic compound layers contains at least one of polyurethane compound having a repeating unit represented by the following general formula (I):

—(OCONH-A-NHCOO—B)$_n$—  General Formula (I)

in the general formula (I), A and B each independently represent a substituted or unsubstituted divalent aliphatic or aromatic hydrocarbon, at least one of A and B represents a divalent group represented by one of the following general formulae (II) to (VI), and n represents a number from 10 to 2000, General Formula (II)

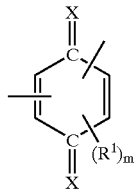

 (II-1)

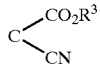 (II-2)

(II-3)

in general formula (II), R$^1$ represents an alkyl group, an aryl group, a halogen atom, a nitro group, an acyl group, or an amino group, X represents an oxygen atom or a group represented by the above formulae (II-1) to (II-3) in which R$^3$ and R$^4$ each independently represent an alkyl group or an aryl group, and m represents an integer from 0 to 2, General Formula (III)

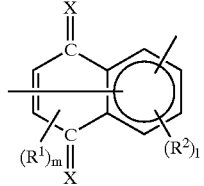

(III-1)

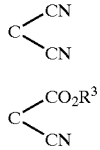

(III-2)

(III-3)

in general formula (III), $R^1$ and $R^2$ each independently represent an alkyl group, an aryl group, a halogen atom, a nitro group, an acyl group, or an amino group, X represents an oxygen atom or a group represented by the above formulae (III-1) to (III-3) in which $R^3$ and $R^4$ each independently represent an alkyl group or an aryl group, and m and l each independently represent an integer from 0 to 2,

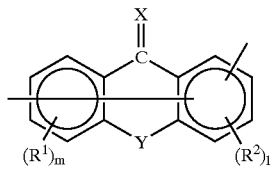

General Formula (IV)

in general formula (IV), $R^1$, $R^2$, X, m, and l each independently have the same meaning as $R^1$, $R^2$, X, m, and l in the general formula (III), respectively, and Y represents the chemical structure C=X, wherein C is a carbon in the ring structure and in which X has the same meaning as X in general formula (III), O, S, $SO_2$, or $NR^5$ in which $R^5$ represents a hydrogen atom, an alkyl group, an aryl group, or an acyl group,

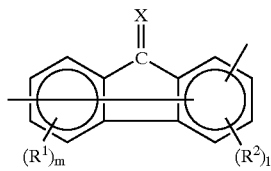

General Formula (V)

in general formula (V), $R^1$, $R^2$, X, m, and l each independently have the same meaning as $R^1$, $R^2$, X, m, and l in general formula (III), respectively,

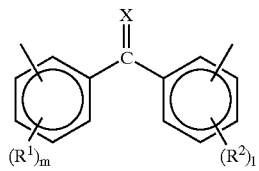

General Formula (VI)

in general formula (VI), $R^1$, $R^2$, X, m, and l each independently have the same meaning as $R^1$, $R^2$, X, m, and l in general formula (III), respectively.

2. An organic electro-luminescent device according to claim 1, wherein the one or more organic compound layers comprise a low-molecular weight organic compound.

3. An organic electro-luminescent device according to claim 2, wherein the low-molecular weight organic compound is an electron-accepting compound.

4. An organic electro-luminescent device according to claim 3, wherein the electron-accepting compound comprises at least one selected from the group consisting of aromatic nitro compounds, cyclic carboxylic anhydrides, aromatic carboxylic imides, quinones, tetracyanoxydimethane derivatives, and fluorenone derivatives.

5. An organic electro-luminescent device according to claim 2, wherein the low-molecular weight organic compound is an electron-donating compound.

6. An organic electro-luminescent device according to claim 5, wherein the electron-donating compound comprises at least one selected from the group consisting of oxadiazoles, styryl system compounds, carbazole compounds, pyrazoline system compounds, triphenylamine system compounds, tetrathiafulvalene, and N,N,N',N'-tetraethylphenylenediamine.

7. An organic electro-luminescent device according to claim 1, wherein the polyurethane compound is a copolymerized polyurethane compound comprising a repeating unit other than the repeating unit represented by general formula (I).

8. An organic electro-luminescent device according to claim 1, wherein the one or more organic compound layers comprise at least a light emitting layer and an electron transporting layer, and the electron transporting layer includes the at least one polyurethane compound having the repeating unit represented by general formula (I).

9. An organic electro-luminescent device according to claim 1, wherein the one or more organic compound layers comprise at least a hole transporting layer, a light emitting layer, and an electron transporting layer, and the electron transporting layer includes the at least one polyurethane compound having the repeating unit represented by general formula (I).

10. An organic electro-luminescent device according to claim 1, wherein the one or more organic compound layers comprise at least a light emitting layer, and the light emitting layer includes the at least one polyurethane compound having the repeating unit represented by general formula (I).

11. An organic electro-luminescent device according to claim 1, wherein the one or more organic compound layers comprise at least a hole transporting layer and a light emitting layer, and the light emitting layer includes the at least one polyurethane compound having the repeating unit represented by general formula (I).

12. An organic electro-luminescent device according to claim 10, wherein the light emitting layer comprises a charge transporting material.

13. An organic electro-luminescent device according to claim 11, wherein the light emitting layer comprises a charge transporting material.

14. An organic electro-luminescent device according to claim 12, wherein the charge transporting material comprises a hole transporting polymer.

15. An organic electro-luminescent device according to claim 13, wherein the charge transporting material comprises a hole transporting polymer.

16. An organic electro-luminescent device according to claim 9, wherein the hole transporting layer comprises a hole transporting polymer.

17. An organic electro-luminescent device according to claim 11, wherein the hole transporting layer comprises a hole transporting polymer.

* * * * *